United States Patent
Moriyasu et al.

Patent Number: 6,139,944
Date of Patent: Oct. 31, 2000

[54] ELECTRONIC DEVICE HAVING A SHEATHED BODY AND A METHOD OF PRODUCING THE SAME

[75] Inventors: Kozo Moriyasu, Muko; Toshiya Oshima, Kameoka; Kunisaburo Tomono, Otsu, all of Japan

[73] Assignee: Murata Manufacturing Co., Ltd., Japan

[21] Appl. No.: 09/139,811

[22] Filed: Aug. 25, 1998

[30] Foreign Application Priority Data

Aug. 25, 1997 [JP] Japan ................... 9-228219
Feb. 25, 1998 [JP] Japan ................. 10-043786

[51] Int. Cl.⁷ .............. B32B 3/26; B32B 3/12
[52] U.S. Cl. ................. 428/316.6; 428/315.9; 428/319.7; 428/308.4; 428/68; 428/76; 428/72; 361/272; 29/25.42; 29/598
[58] Field of Search ............. 428/68, 76, 72, 428/218, 316.6, 319.7; 361/272; 29/25.42

[56] References Cited

U.S. PATENT DOCUMENTS

| | | | |
|---|---|---|---|
| 3,851,363 | 12/1974 | Booe | 29/25.4 |
| 4,439,810 | 3/1984 | Shimada et al. | 361/272 |
| 4,670,816 | 6/1987 | Johnk | 361/323 |
| 5,381,301 | 1/1995 | Hudis | 361/275.2 |

*Primary Examiner*—Terrel Morris
*Assistant Examiner*—Sharmistha Gupta
*Attorney, Agent, or Firm*—Ostrolenk, Faber, Gerb & Soffen, LLP

[57] ABSTRACT

An electronic device 1 includes an electronic element 3 having an outer sheath 5 covering at least substantially the entire outer surface of the electronic element. The outer sheath 5 has three layers: a first thermoplastic layer 5a formed on at least substantially the entire outer surface of the electronic element; a thermoplastic resin layer 5a formed on at least substantially the entire outer surface of the first thermosetting layer 5a, and a second thermoplastic resin layer 5b formed on at least substantially the entire outer surface of the thermoplastic layer. The outer sheath is formed by placing an uncured thermosetting resin on the outer surface of the electronic element to form the first thermosetting resin layer placing an uncured thermosetting resin on the outer surface of the first thermosetting resin layer to form the thermoplastic layer and placing an uncured thermosetting resin layer on the thermoplastic layer to form the second thermosetting resin layer. All three layers are then heated so as to cure the first and second thermosetting resin layer and to cause the thermoplastic layer to melt and form a non-porous layer which is subsequently solidified.

10 Claims, 6 Drawing Sheets

ELECTRONIC DEVICE HAVING A SHEATHED BODY AND A METHOD OF PRODUCING THE SAME

FIELD OF THE INVENTION

The present invention relates to an electronic device coated with resin and a method producing the same.

BACKGROUND OF THE INVENTION

Most ceramic filters, hybrid ICs and ceramic capacitors (as well as many other electronic devices) include a sheath covering the internal electronic element to protect the device from external shock. The sheath is typically made from a thermosetting resin which is resistant to both heat and physical shock. An exemplary structure is shown in FIG. 11. The device 20 includes an electronic element body 21, lead terminals 25 which are electrically connected to the body 21, and an outer sheath 22 covering the body 21. The outer sheath 22 is formed of a thermosetting resin.

The outer sheath 22 is typically formed by dipping the body 21 into a resin paste (prepared by dispersing a coating material of a thermosetting resin in an organic solvent) to adhere the resin paste to the body 21 and then drying the paste and removing the organic solvent from the resin paste through evaporation in air at room temperature. These steps are repeated until a desired thickness of the thermosetting resin has been applied to the electronic element body 21. Next, the thus-coated electronic device 20 is heated at a predetermined temperature to cure the thermosetting resin with the result that the electronic element body 21 is protected with the cured resin.

When the electronic device 20 has vibrating components such as electrodes 24, an empty space 23 must be formed around each such vibrating element to ensure that it is free to vibrate. To this end, a thermo-subliming material (such as wax) is applied to the region corresponding to the empty spaces 23 prior to applying a thermosetting resin onto the body 21. Then, the body 21 is processed as described above. The thermo-subliming material has a sufficiently low melting point that it will melt during the heating step used to cure the thermosetting resin, will evacuate the area corresponding to the empty spaces 23 and will be absorbed in the pores of the outer sheath 22.

The conventional electronic device 20 and the method for producing it have the following drawbacks.

The porosity of the thermosetting resin used for forming the outer sheath provides a good impact resistance, makes it easy to mark the surface of the outer sheath and absorbs the wax or other thermo-subliming material which has been evaporated from the empty spaces 23. However, it exhibits a poor moisture resistance, with the result that the characteristics of the electronic devices are often degraded.

SUMMARY OF THE INVENTION

An object of the present invention is to provide an electronic device coated with an outer sheath that is resistant to both physical shocks and moisture, and to provide a method of producing the same.

The present invention includes an electronic device, comprising:
  an electronic element;
  an outer sheath covering at least substantially all of the outer surface of the electronic element, the outer sheath comprises at least one thermosetting resin layer and at least one thermoplastic resin layer.

The thermoplastic layer is preferably significantly less porous than the thermosetting layer after both layers have been cured with the thermosetting layer preferably having a porosity of about 25 to 40 percent. The thermoplastic layer may have a porosity of about 30 to 60 percent before curing. The thermoplastic layer is preferably a non-porous film layer after curing.

The outer sheath is preferably formed of three layers. A first thermosetting layer covers at least substantially the entire outer surface of the electronic element, a thermoplastic layer covers at least substantially the entire outer surface of the first thermosetting layer and a second thermosetting layer covers at least substantially the entire thermoplastic layer. The first and second thermosetting layers are preferably formed of the same material. When the electronic element includes vibrating portions, empty spaces are formed by areas of the outer sheath which are spaced from the outer surface of the electronic element body.

The electronic device is formed by a method comprising the steps of:
  (1) forming a green outer sheath on an outer surface of an electronic element, the outer sheath including at least one thermosetting resin layer and at least one thermoplastic layer;
  (2) heating the green outer sheath to thermally cure the thermosetting resin layer and melt the thermoplastic resin layer; and
  (3) solidifying the melted thermoplastic layer.

In the preferred embodiment, the green outer sheath comprises a first thermosetting resin layer covering at least substantially the entire outer surface of the electronic element, a thermoplastic layer covering at least substantially the entire outer surface of the first thermoplastic layer and a second thermosetting resin layer covering at least substantially the entire outer surface of the thermoplastic resin layer and wherein both the first and second thermosetting resin layers are cured during the heating step. When it is desirable to form empty spaces in the outer sheath, for example when the electronic element includes vibrating portions, the method further comprises the step of placing a thermo-subliming material, for example wax, on a portion of the outer surface of the electronic element before the step of forming the green outer sheath so that the green outer sheath is spaced from associated portions of the outer surface of the electronic element. In this case, the heating step is carried out in such a manner that the thermo-subliming material melts and dispersed into the first and second thermosetting resin layers before the thermoplastic resin layer is melted and empty spaces are left in the area where the thermo-subliming material was originally placed.

The heating step is carried out by first heating the green outer sheath at a temperature not lower than the melting point of the thermo-subliming material but lower than the melting point of the thermoplastic resin layer to cause the thermo-subliming material to evacuate the empty space and disperse into the first and second thermosetting resin layers and then heating the outer sheath at a temperature not lower than the melting point of the thermosetting resin layer to thermally cure the first and second thermosetting resin layers while melting the thermoplastic resin layer.

The green sheath is preferably formed by:
  (1) applying a thermosetting resin to at least substantially the outer surface of the electronic element to form the first thermosetting resin layer;
  (2) applying a thermoplastic resin to at least substantially the first thermosetting resin layer to form the thermoplastic resin layer; and (3) applying a thermosetting resin to at least substantially the outer surface of the thermoplastic resin layer to form the second thermosetting layer.

According to the preferred embodiments of the invention which includes a three layer outer sheath, the outer sheath is advantageous in that the first and second thermosetting resin layers absorb external shock while preventing it from being transmitted to the electronic element, and that the thermoplastic resin layer protects the electronic element from moisture in air. Accordingly, the electronic device of the invention has good moisture resistance, and the adhesion between the electronic element and the outer sheath in the device is good. In addition, since the second thermosetting resin layer is the outermost layer of the outer sheath, the outer sheath is resistant to external shock and is easy to mark.

Other features and advantages of the present invention will become apparent from the following description of the invention which refers to the accompanying drawings.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

DESCRIPTION OF PREFERRED EMBODIMENTS OF THE INVENTION

Figure 1:
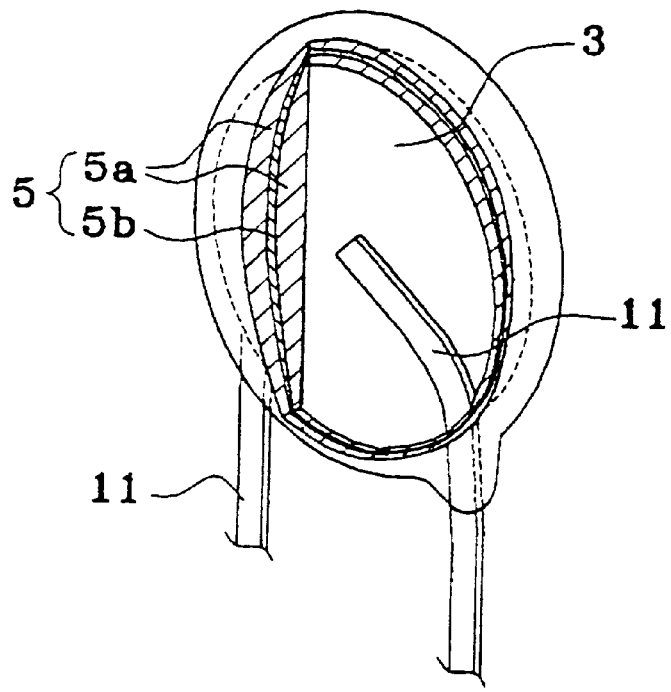
FIG. 1 is a perspective view, partly broken away, of the electronic device of Example 1.

The electronic device of the present invention comprises an electronic element body covered by a multi-layer outer sheath which is both water resistant and resistant to mechanical shock. The outer sheath includes a plurality of layers, at least one of which is relatively porous and at least one of which is relatively non-porous. The relatively porous layer serves to resist shocks. The relatively non-porous layer serves to resist water penetration.

In the preferred embodiments of the invention, the sheath is made up of three layers: two relatively porous layers and a relatively non-porous layer located therebetween. The relatively porous layers are formed of a thermosetting material which is relatively porous both before and after it is cured. Preferably, the porosity of the thermosetting layer is between about 25 and 40 percent. The relatively non-porous layer is formed of a thermoplastic material which is relatively porous before it is cured and relatively non-porous after it is cured. This is especially advantageous when a thermo-subliming material such as wax is used to create empty spaces in the sheath at locations where vibrating components of the electronic element are located. In such a case, the thermo-subliming material is melted before the thermoplastic material is cured and is allowed to evacuate the empty area, migrate through all three layers and settle into the pores of the of the thermosetting layers. Once the migration is completed, the thermoplastic material is permitted to set and forms a water proof boundary through which neither water nor the thermo-subliming material is permitted to pass. The thermoplastic layer may have a porosity of between about 30 and 60 percent after it has been cured.

In the preferred embodiment, the sheath has empty areas surrounding vibrating components of the electronic element body and a thermo-subliming material which was located in the empty areas before curing of the sheath is located in pores of the thermosetting material. The thermo-subliming material preferably has a melting point below that of curing temperature of the thermosetting and thermoplastic materials.

The electronic element preferably comprises a dielectric or piezoelectric ceramic part or the like. The electronic device can, by way of example, take the form of a tabular ceramic capacitor, a surface wave filter, a hybrid IC, etc. There is no limitation on the particular materials, use and shape of the electronic device.

Various thermosetting resins, for example, epoxyphenol resins and epoxy-modified silicones, can be used to form the thermosetting layer(s). These resins are exemplary only and the invention is not limited to these examples. Where wax is used as the thermo-subliming material to form an empty spaces in the sheath, it is desirable that the thermosetting resin have a porosity of about 25 to 40 percent.

Various thermoplastic resins can be used to form the thermoplastic resin layer(s) of the sheath. The thermoplastic resin is preferably capable of being melted and formed into a film, since the layer must be resistant to moisture. By way of example, polyolefinic resins such as polyethylene, polybutadiene, polyethylene terephthalate, etc., can be used. The thermoplastic layer preferably has few pin holes and sufficiently thick to ensure that it will have a high moisture resistance. To this end, the mean grain size of the grains constituting the thermoplastic resin is preferably not larger than 30 µm.

Any acceptable method can be used to apply the outer sheath to the electronic element in an air-tight manner. By way of example, the resin for forming the outer sheath may be applied to electronic element either by dipping it into a resin paste (prepared by dissolving an outer sheath-forming material in an organic solvent), by applying a powdery sheath-forming material to the surface of the electronic element through fluidized dipping or electrostatic spray coating or by casting the sheath forming material onto the electronic element. The dipping method is preferred, since several layers, formed from different sheath forming materials, are preferably formed around the electronic element. The dipping method reduces the load applied to the electronic element and reduces production costs.

When one or more empty spaces are formed in the sheath to accommodate vibrating components of the electronic element, the size of the empty spaces are preferably large enough to permit the desired vibrations but are otherwise minimized in size. In accordance with the preferred embodiment of the invention, the empty space(s) is formed by applying wax onto a surface of the electronic element over an area corresponding to the desired area of the empty space. Any wax (or other thermo-subliming material) can be used provided that it has a melting point which is lower than the melting point of the thermoplastic resin to be applied to the electronic element. Typically, the melting point should fall between 50° C. and 100° C. By way of example, paraffin wax, microcrystalline wax or the like may be used.

When a thermal-subliming material such as wax is used to form the empty spaces, the coated electronic element is heated to (1) melt the wax so that it is absorbed by the outer sheath and (2) cure and solidify the outer sheath. To achieve this result, the electronic element may be heated in two stages, first at a predetermined temperature not lower than the melting point of the wax but lower than the melting point of the thermoplastic resin for a predetermined period of time and then at an elevated temperature not lower than the melting point of the thermoplastic resin. Alternatively, the body can may be heated continuously up to the temperature of the melting point of the thermoplastic resin and beyond. The invention is not limited to the specific heating temperature-elevating pattern and the heating method is not specifically defined. Whichever heating step is used, the grains of the thermoplastic, resin still exist at random without being densified so that the wax melt passes freely through the thermoplastic resin layer and is entirely absorbed by the outer sheath.

Whatever method is used, it is preferred that the wax be completely heated and absorbed by the outer sheath before the thermoplastic resin begins to melt. More preferably, the coated electronic element should be heated at a temperature not lower than the melting point of the wax but lower than the melting point of the thermoplastic resin for a predetermined period of time to ensure that the wax is entirely absorbed by the outer sheath, and thereafter should be heated at an elevated temperature not lower than the melting point of the thermoplastic resin to melt the thermoplastic resin. In this way, the wax is initially permitted to pass through the thermoplastic resin and be absorbed by the relatively porous thermosetting resin and, only after the wax is melted and absorbed, the thermoplastic resin is melted and made into a non-porous sheet which will act as a water resistant barrier for the electronic element.

Two non-limiting examples of the invention will now be described with reference to the drawings wherein like numerals indicate like elements.

EXAMPLE 1

In this example, the electronic device 1 comprises an electronic element 3, lead terminals 11 which are electrically connected to the electronic element 3, and a three-layered outer sheath 5 which is composed of first and second thermosetting resin layers 5a and a single thermoplastic resin layer 5b located therebetween. The first and second thermosetting resin layers 5a are made of an epoxyphenol resin. The intermediate thermoplastic resin layer 5b is made of a polyolefinic resin.

The electronic device 1 of Example 1 is prepared as follows. An epoxyphenol and a polyolefinic resin paste are prepared as the thermosetting resin and the thermoplastic resin, respectively, by dissolving them in an organic solvent, preferably xylol.

Figure 2:
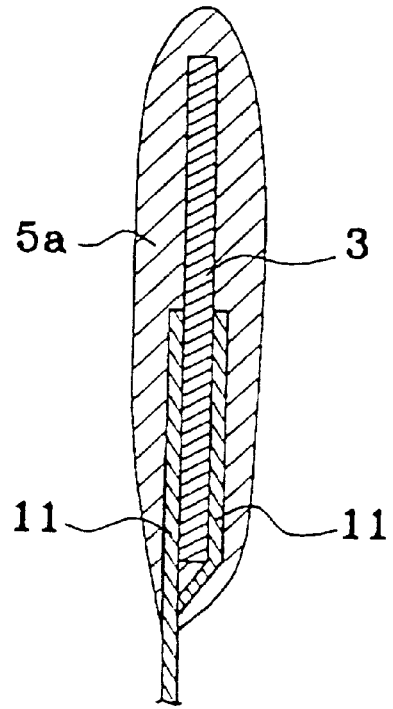
FIG. 2 is a cross-sectional view illustrating one step of the process for producing the electronic device of Example 1, in which is formed a first thermosetting resin layer.
Figure 3:
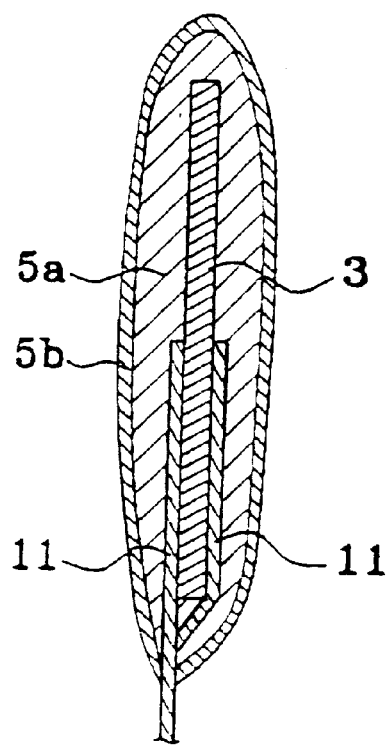
FIG. 3 is a cross-sectional view illustrating another step of the process for producing the electronic device of Example 1, in which was formed a thermoplastic resin layer.
Figure 4:
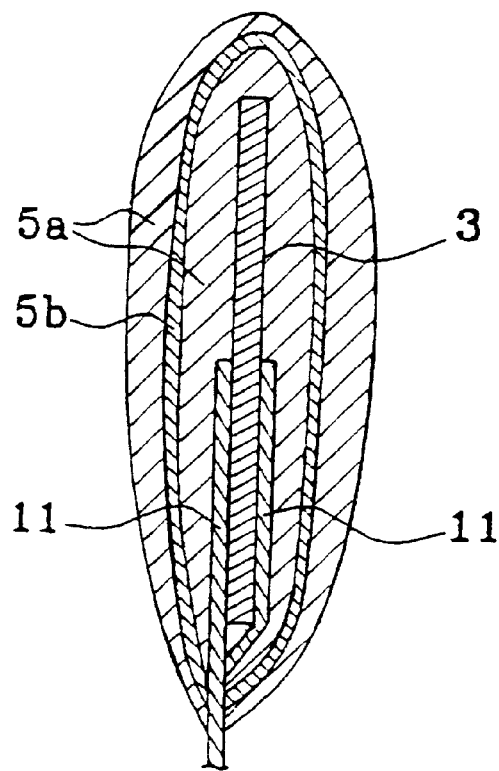
FIG. 4 is a cross-sectional view illustrating still another step of the process for producing the electronic device of Example 1, in which was formed a second thermosetting resin layer.
Figure 5:
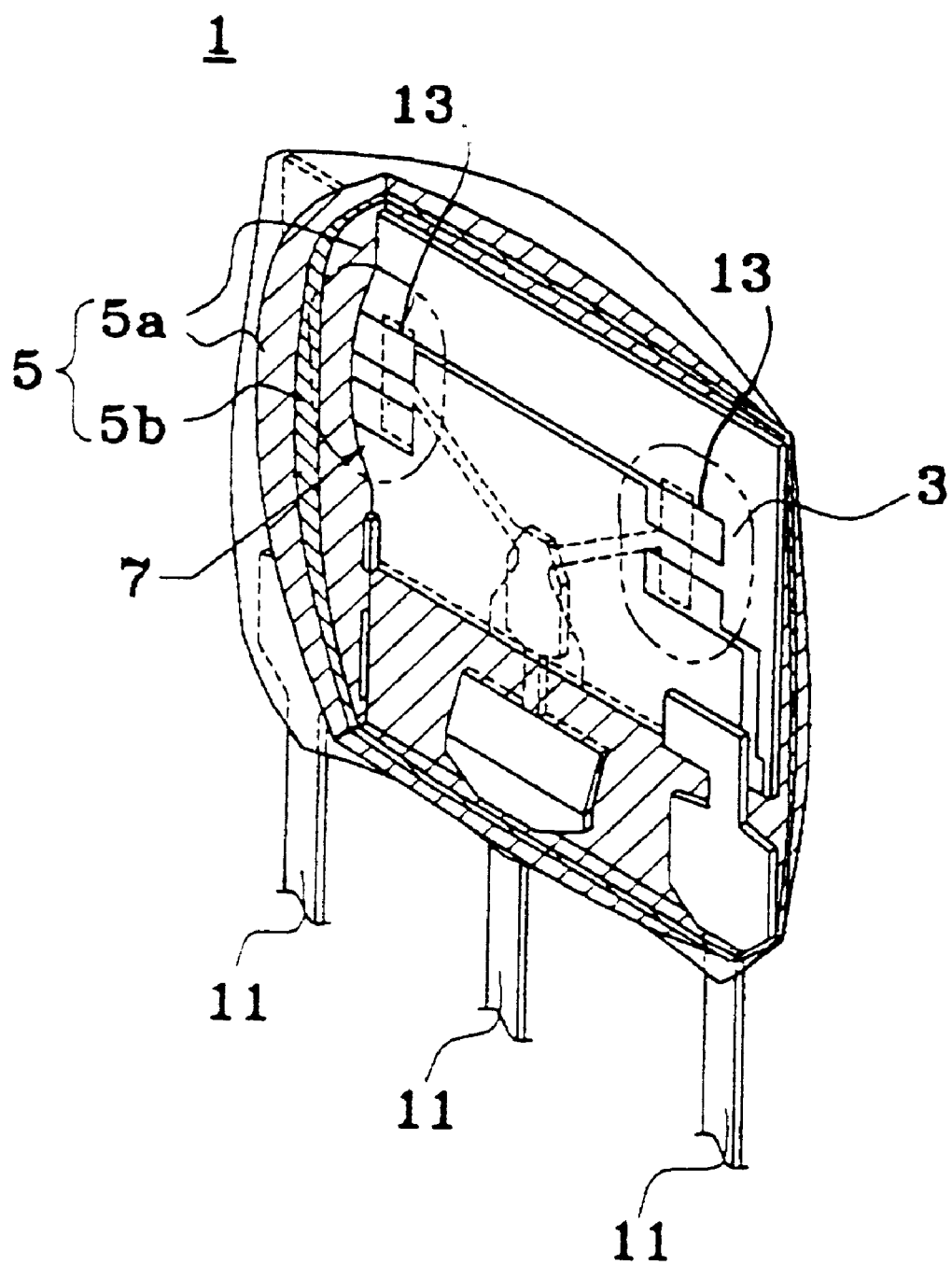
FIG. 5 is a perspective view, partly broken away, of the electronic device of Example 2.

Next, an electronic element 3 is coated with the thermosetting resin paste by dipping it into the paste. The so applied thermosetting resin paste is dried to form a first thermosetting resin layer 5a as shown in FIG. 2. The electronic element 3 with the first thermosetting resin layer 5a is then dipped into the thermoplastic resin paste to coat the first thermosetting layer with the thermoplastic paste. This paste is allowed to dry form a thermoplastic resin layer 5b as shown in FIG. 3. Next, the electronic element 3, already coated with the first thermosetting layer 5a and the thermoplastic layer 5b is again dipped in the thermosetting resin paste to apply a coat of the paste over the thermoplastic layer 5b. The newly applied coat is dried to form the second thermosetting resin layer 5a as shown in FIG. 4.

Next, the electronic device 1 is heated at a temperature not lower than the melting point of the thermoplastic resin, and preferably to a temperature falling between 150° C. and 180° C. to thereby melt the layer 5b into a film, precisely, into a layered film, while curing the thermosetting resin to form the outer sheath 5 tightly adhered to the electronic element 3. Finally the device 1 is cooled.

EXAMPLE 2

Electronic device 1 of this Example 2 comprises an encapsulated electronic element in the form of a piezoelectric ceramic element 3 having electrodes 13 formed thereon. The electrodes represent vibrating elements of the electronic element and are electrically connected to lead terminals 11 which extend outside a three-layer outer sheath 5. The sheath 5 is composed of first and second thermosetting resin layers 5a which sandwich an intermediate thermoplastic resin layer 5b. In this Example, empty spaces 7 are formed in the outer sheath 5 in the areas around each electrode 13. The size of the empty spaces is sufficient to provide a vibrational area for each of the electrodes 13 but is otherwise minimized. This ensures that the sheath 5 is spaced from the electrodes 13 via those empty spaces 7.

Since the parts of the device 1 of Example 2 other than the empty spaces 7 are the same as those in the device 1 of Example 1, no further description is provided.

The device 1 of Example 2 is formed as follows. An epoxyphenol resin is prepared as the thermosetting resin, and a polyolefinic resin having a melting point of 140° C. is prepared as the thermoplastic resin by dissolving them in an organic solvent, preferably xylol, to prepare resin pastes. A paraffin wax having a melting point of 60° C. is prepared to be used as the wax for forming the empty spaces 7.

Figure 6:
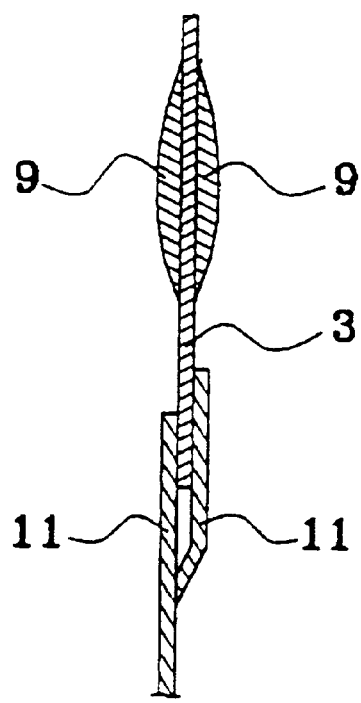
FIG. 6 is a cross-sectional view illustrating one step of the process for producing the electronic device of Example 2, in which was formed a wax layer.
Figure 7:
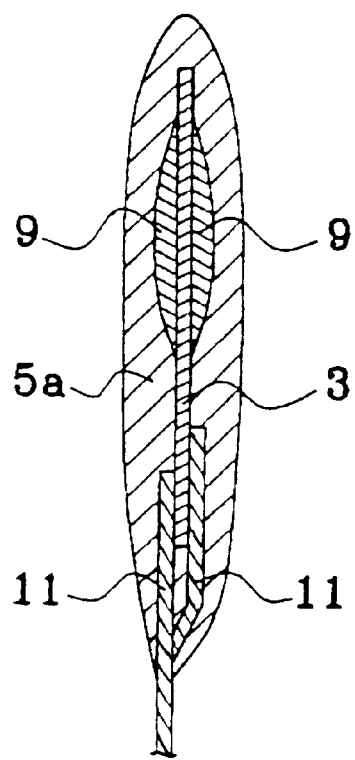
FIG. 7 is a cross-sectional view illustrating another step of the process for producing the electronic device of Example 2, in which was formed a first thermosetting resin layer.
Figure 8:
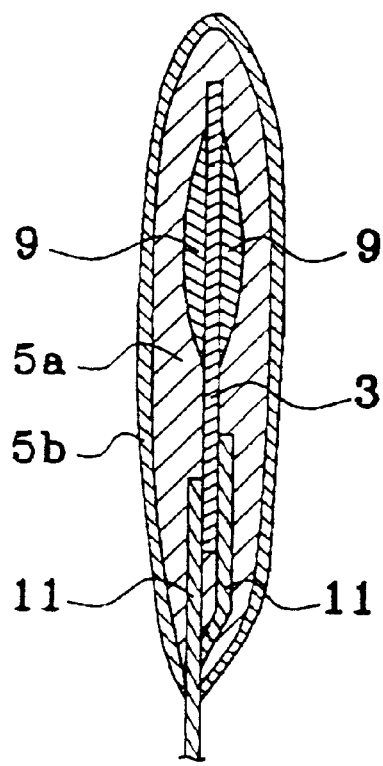
FIG. 8 is a cross-sectional view illustrating still another step of the process for producing the electronic device of Example 2, in which was formed a thermoplastic resin layer.
Figure 9:
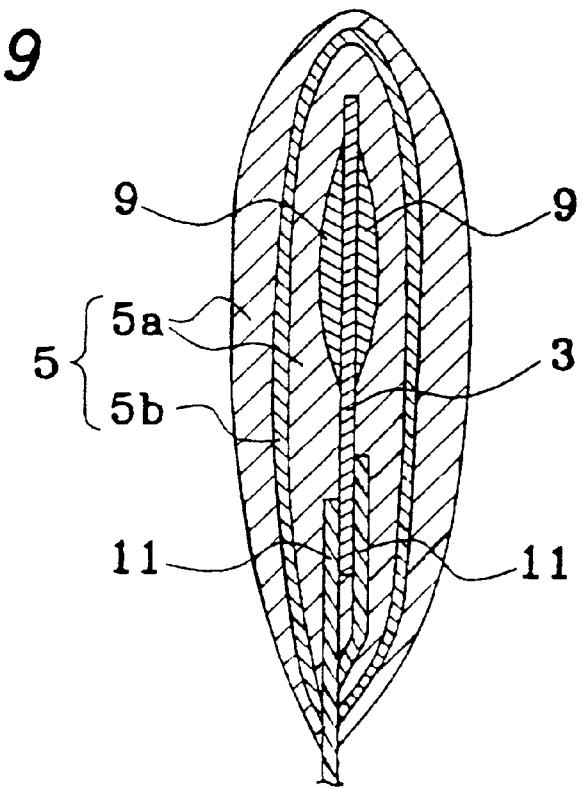
FIG. 9 is a cross-sectional view illustrating still another step of the process for producing the electronic device of Example 2, in which was formed a second thermosetting resin layer.

The liquid wax 9 is deposited onto the body of the electronic element 3 to cover electrodes (not shown), and then solidified to form a wax layer 9 as shown in FIG. 6. Next, the electronic element 3 is dipped into the thermosetting resin paste to coat it with the paste, and the paste is dried to form a first thermosetting resin layer 5a as shown in FIG. 7. The electronic element 3 with the first thermosetting layer 5a thereon is then dipped into the thermoplastic resin paste to coat it with the paste, and the paste is dried to form a thermoplastic resin layer 5*b* as shown in FIG. 8. Thereafter, the electronic element 3 having the layers 5*a* and 5*b* thereon is again dipped in the thermosetting resin paste and the so applied paste is dried to form a second thermosetting resin layer 5*a* as shown in FIG. 9. At this point the sheath 5 comprises three uncured layers.

Figure 10:
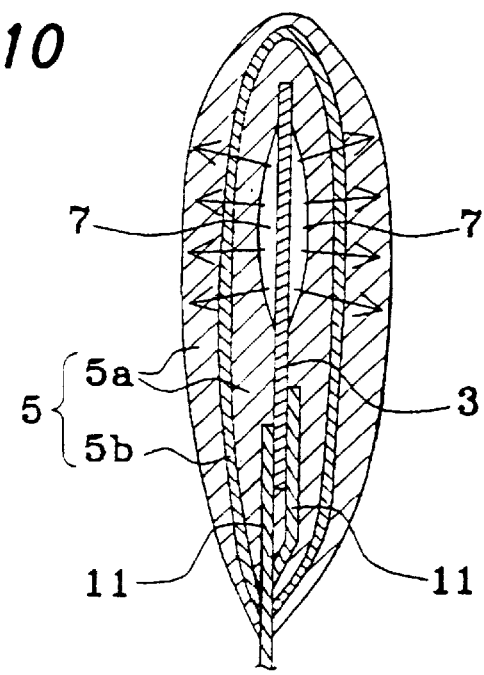
FIG. 10 is a cross-sectional view illustrating still another step of the process for producing the electronic device of Example 2, in which the wax was heated and dispersed.
Figure 11:
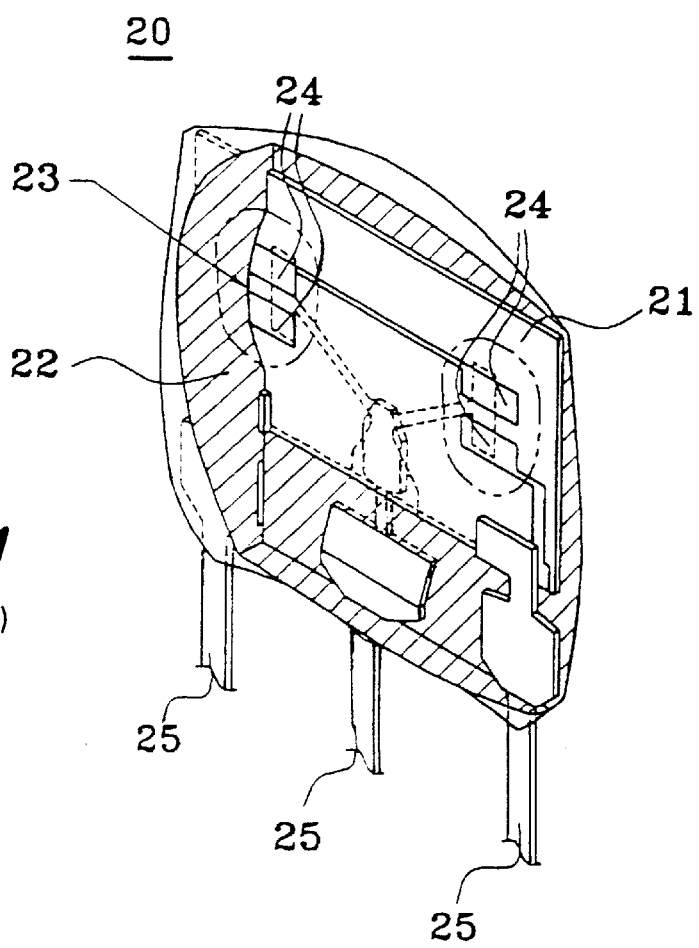
FIG. 11 is a partly-sectioned, perspective view of a conventional electronic device.

The device 1 is then heated at a temperature of 100° C., which is higher than the melting point (60° C.) of the wax 9 and is lower than the melting point (140° C.) of the thermoplastic resin, for a predetermined period of time sufficient to permit the wax 9 to leave the empty spaces 7 and be absorbed by the outer sheath 5 as shown in FIG. 10 (the arrows show the direction of movement of the wax 9 from the empty spaces 7 to the outer sheath 5). Next, the device 1 is again heated at a temperature falling between 150° C. and 180° C., which is higher than the melting point, of the thermoplastic resin, to melt the thermoplastic resin layer 5*b* into a film, while curing the first and second thermosetting layers 5*a*. Finally, the device 1 is allowed to cool.

As has been mentioned in detail hereinabove, the electronic device of the preferred embodiments is coated with an outer sheath composed of three layers of different two types of resins: two layers of a thermosetting resin having high impact resistance and one layer of a thermoplastic resin having high moisture resistance. Therefore, the device has high strength well resistant to external shock and has good moisture resistance.

While the invention has been described in detail and with reference to specific embodiments thereof, it will be apparent to one skilled in the art that various changes and modifications can be made therein without departing from the spirit and scope thereof.

What is claimed is:

1. An electronic device, comprising:

an electronic element;

an outer sheath covering at least substantially all of the outer surface of the electronic element, the outer sheath comprises at least one thermosetting resin layer and at least one thermoplastic resin layer.

2. The electronic device according to claim 1, wherein the thermoplastic layer is significantly less porous than the thermosetting layer after both layers have been cured.

3. The electronic device according to claim 2, wherein the thermosetting layer has a porosity of about 25 to 40 percent.

4. The electronic device according to claim 3, wherein the thermoplastic layer has a porosity of about 30 to 60 percent before being cured.

5. The electronic device according to claim 1, wherein the thermosetting layer has a porosity of greater than about 25 percent and the thermoplastic layer is a non-porous film layer.

6. The electronic device according to claim 1, wherein the first thermosetting layer covers at least substantially the entire outer surface of the electronic element and the first thermoplastic layer covers at least substantially the entire outer surface of the first thermosetting layer.

7. The electronic device according to claim 1, wherein the outer sheath further includes a second thermosetting layer covering at least substantially the entire outer surface of the thermoplastic layer.

8. The electronic device according to claim 7, wherein the first and second thermosetting layers are formed of the same material.

9. The electronic device according to claim 8, wherein the first thermosetting layer covers at least substantially the entire outer surface of the electronic element, the first thermoplastic layer covers at least substantially the entire outer surface of the first thermosetting layer and the second thermosetting layer covers at least substantially the entire outer surface of the first thermoplastic layer.

10. The electronic device according to claim 1, wherein empty spaces are formed by areas of the outer sheath which are spaced from the outer surface of the electronic element body.

* * * * *